(12) United States Patent
Goeppert et al.

(10) Patent No.: US 9,482,968 B2
(45) Date of Patent: Nov. 1, 2016

(54) MEASURING SYSTEM

(71) Applicant: Carl Zeiss SMT GmbH, Oberkochen (DE)

(72) Inventors: Markus Goeppert, Karlsruhe (DE); Helmut Haidner, Aalen (DE); Rolf Freimann, Aalen (DE); Christoph Striebel, Dornstadt (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 395 days.

(21) Appl. No.: 14/100,742

(22) Filed: Dec. 9, 2013

(65) Prior Publication Data
US 2014/0118712 A1 May 1, 2014

Related U.S. Application Data

(63) Continuation of application No. PCT/EP2012/060649, filed on Jun. 6, 2012.

(60) Provisional application No. 61/494,678, filed on Jun. 8, 2011.

(30) Foreign Application Priority Data

Jun. 8, 2011 (DE) .................. 10 2011 077 223

(51) Int. Cl.
*G03B 27/54* (2006.01)
*G03F 9/00* (2006.01)
*G03F 7/20* (2006.01)
(Continued)

(52) U.S. Cl.
CPC .................. *G03F 9/00* (2013.01); *G01B 11/02* (2013.01); *G01M 11/0264* (2013.01); *G03F 7/706* (2013.01); *G03F 7/7085* (2013.01)

(58) Field of Classification Search
CPC ........ G03F 7/706; G03F 7/7085; G03F 9/00; G01B 11/02; G01M 11/0264
USPC ........................................... 355/67
See application file for complete search history.

(56) References Cited

U.S. PATENT DOCUMENTS 4,790,642 A 12/1988 Bruning et al.
6,859,515 B2 2/2005 Schultz et al.
(Continued)

FOREIGN PATENT DOCUMENTS

DE 10 2007 041 004 A1 3/2009
DE 10 2008 009 600 A1 8/2009
(Continued)

OTHER PUBLICATIONS

Machine translation of Jp 2002-083760, Mar. 22, 2002.*
(Continued)

*Primary Examiner* — Peter B Kim
(74) *Attorney, Agent, or Firm* — Edell, Shapiro & Finnan, LLC

(57) ABSTRACT

An objective for a projection exposure apparatus includes a metrology stage arranged on the frame of the objective. The objective includes at least one optical component, an objective mount for mounting the optical component, and a positioning device for holding at least one measuring device. The positioning device is connected to the objective mount and has at least one degree of freedom of displacement for displacing the measuring device.

18 Claims, 13 Drawing Sheets

(51) Int. Cl.
*G01M 11/02* (2006.01)
*G01B 11/02* (2006.01)

(56) References Cited

U.S. PATENT DOCUMENTS

| | | |
|---|---|---|
| 7,333,216 B2 | 2/2008 | Wegmann et al. |
| 2004/0207828 A1 | 10/2004 | Miyajima |
| 2009/0002663 A1 | 1/2009 | Freimann et al. |
| 2009/0233234 A1 | 9/2009 | Shibazaki |
| 2011/0013171 A1 | 1/2011 | Mueller et al. |

FOREIGN PATENT DOCUMENTS

| | | |
|---|---|---|
| DE | 10 2008 030 664 A1 | 1/2010 |
| DE | 10 2010 038 697 A1 | 2/2013 |
| EP | 1 197 801 A1 | 4/2002 |
| JP | 63-006511 A | 1/1988 |
| JP | 6-151278 A | 5/1994 |
| JP | H11233416 A | 8/1999 |
| JP | 2002083760 A | 3/2002 |
| JP | 2010500770 A | 1/2010 |
| JP | 2011510494 A | 3/2011 |
| WO | 2009/024164 A1 | 2/2009 |

OTHER PUBLICATIONS

German Office Action of 10 2011 077 223.5 dated Feb. 14, 2012.
International Search Report of PCT/EP2012/060649 dated Aug. 3, 2012.
Office Action in corresponding Chinese Application No. 201280028001.6, dated Apr. 30, 2015, along with an English translation.
Office Action in corresponding Chinese Application No. 201280028001.6, dated Feb. 25, 2016, along with an English translation.
English language Office Action Summary in corresponding Japanese Application No. 2014-514048, mailed Apr. 26, 2016.

\* cited by examiner

MEASURING SYSTEM

The present application is a Continuation of International Application No. PCT/EP2012/060649, filed on Jun. 6, 2012, which claims priority of German Patent Application No. 10 2011 077 223.5, filed on Jun. 8, 2011, and U.S. Provisional Application No. 61/494,678, also filed on Jun. 8, 2011. The disclosures of these three applications are hereby incorporated into the present application by reference in their respective entireties.

FIELD AND BACKGROUND OF INVENTION

The invention relates to a measuring system for characterizing at least one component of a projection exposure apparatus. The invention furthermore relates to an objective for a projection exposure apparatus, a projection optical unit comprising an objective of this type, and a projection exposure apparatus comprising a projection optical unit of this type. Furthermore, the invention relates to a method for characterizing at least one component of a projection exposure apparatus, a method for producing a microstructured component, and a component produced according to this method.

A projection exposure apparatus comprising a measuring device is known from US 2011/0013171 A1, for example.

OBJECTS AND SUMMARY

The invention is based on the object of improving a measuring system for characterizing at least one component of a projection exposure apparatus.

One predominant aspect of the invention consists in connecting a positioning device for positioning at least one measuring device to an objective of the projection exposure apparatus in a displaceable manner. The positioning device is, in particular, a so-called "metrology stage". It serves, in particular, for the arrangement of a multiplicity of measuring devices comprising, for example, electro-optical detectors for converting optical signals into electrical signals. The measuring device can comprise spatially resolving, in particular two-dimensionally spatially resolving, radiation detectors, for example one or more CCD cameras. It can comprise, in particular, an apparatus for measuring a lateral image offset and/or an apparatus for a pupil transmission measurement and/or an apparatus for a wavefront measurement and/or an apparatus for a spectrometric measurement.

The arrangement of the positioning device at the objective enables a particularly stable and thus reproducible arrangement of the at least one measuring device relative to the objective. Moreover, an arrangement of this type enables the positioning, in particular the shifting, of the at least one measuring device independently of the displacement of other constituents of the projection exposure apparatus, in particular independently of a displacement of a wafer mount. A further advantage of the arrangement according to the invention is that the arrangement of the positioning device at the objective enables an improved utilization of the space available in the wafer plane, i.e. in the image plane of the projection optical unit.

The positioning device has at least one degree of freedom of displacement. It is displaceable, in particular, in a direction transversely with respect to the optical axis of the objective. With the positioning device, the at least one measuring device is displaceable, in particular, between at least one measurement position in the beam path of the objective and a parking position, in which it is arranged preferably completely outside the beam path of the objective. In this case, the at least one measurement position and the parking position can be spaced apart from one another by more than 1 mm, in particular more than 1 cm, in particular more than 5 cm.

As an alternative or in addition to a displaceability transversely with respect to the optical axis, the at least one measuring device can be displaced by the positioning device in a direction parallel to the optical axis of the objective. In one particularly advantageous embodiment, the positioning device can also have a degree of freedom of rotation. It can enable, in particular, a rotation of the at least one measuring device about an axis parallel to the optical axis of the objective.

Preferably, the measuring system comprises at least one radiation source for generating measurement radiation. The radiation source can be an EUV radiation source. In particular, the same radiation source which is used for imaging a structure in an object field onto a wafer arranged in the image field can be involved. As an alternative thereto, the measuring system can also comprise a separate radiation source for generating measurement radiation. The measurement radiation can be, in particular, in a wavelength range which is free of overlap with the wavelength range which is for the imaging of the structures arranged in the object field onto the wafer arranged in the image field. The wavelength of the radiation generated by the radiation source of the measuring system is, in particular, in a wavelength range in which a light-sensitive coating used for patterning the wafer is insensitive. This is particularly advantageous since the exposure of the wafer in this case is insensitive to scattering of the measurement radiation. The radiation source of the measuring system can be, in particular, one or a plurality of light-emitting diodes (LED). The latter can generate light having the same or different wavelengths. The radiation from the radiation source can be coupled in by an imaging optical unit. In this case, the imaging optical unit can comprise one or a plurality of optical waveguides.

Preferably, the at least one measuring device is arranged near the pupil or near the field. It can be arranged, in particular, in the region of a pupil plane of the objective or in the region of an intermediate image plane. Arrangements of this type are advantageous depending on the type of measurements provided. In one particularly advantageous embodiment, the positioning device enables a displacement of the measuring device in a direction parallel to the optical axis of the objective.

The measuring system can furthermore comprise a specific measuring reticle. The latter can be arranged on a reticle holder. This can be the same reticle holder which is provided for mounting the reticle having the structures to be imaged onto a wafer. As an alternative thereto, a separate measuring reticle holder can also be provided. The measuring reticle holder and the reticle holder can, in particular, be displaceable independently of one another. As a result, the flexibility of the measuring system is increased further. The holders are also designated as "stages".

A further object of the invention is to improve an objective for a projection exposure apparatus.

Another predominant aspect of the invention is to mount a metrology stage on the frame of the objective. The metrology stage is connected in particular directly to the objective frame. It has at least one degree of freedom of displacement for displacing at least one measuring device arranged on the metrology stage. The degree of freedom of displacement can be a linear degree of freedom and/or a degree of freedom of rotation. The metrology stage is, in particular, displaceable in a direction transversely, in particular perpendicular, with respect to the optical axis of the objective and/or in a direction parallel to the optical axis of the objective and/or rotatable about an axis parallel to the optical axis of the objective. The advantages correspond to those of the measuring system described above.

Preferably, a plurality of measuring devices can be arranged on the metrology stage.

The positioning device, in particular the metrology stage, and/or the measuring device can be considered elements of the objective. They can also be considered separate elements connected to the frame of the objective but localized outside the objective.

The positioning device is preferably configured such that the at least one measuring device is localized outside a range, in which the optical components of the objective are arranged. The measuring device can be preferably arranged in direction of the beam path of the objective after the last optical component of the objective.

Preferably, the at least one measuring device is displaceably between at least one measurement position, in which it is arranged inside the beam path of the objective, and a parking position, in which it is arranged completely outside the beam path of the objective.

Preferably, an actuator for calibrating the objective is provided. The actuator can be connected to the at least one measuring device arranged on the metrology stage in particular in a data-transmitting manner. In this case, the metrology stage forms a constituent of an objective manipulator, in particular for calibrating the objective. In other words, the objective can have a calibration device in the form of at least one measuring device arranged on the metrology stage, and an actuator.

Preferably, the positioning device is free of interaction with magnetic fields. It is embodied, in particular, in such a way that its drive does not react to external magnetic field changes. Changes of this type can be brought about, for example, by the drive of a wafer mount. Conversely, the positioning device, in particular the drive thereof, is embodied in such a way that it does not generate a magnetic field, in particular does not influence an external magnetic field. This can be achieved, in particular, by virtue of the fact that the positioning device has a piezo-actuator or piezo-drive as drive. Very high drive forces can be generated by a piezo-drive of this type. They can additionally be driven very precisely. Finally, drives of this type are vacuum-suitable. Consequently, vacuum-compatible drives are involved. This is particularly advantageous since the objective with the metrology stage according to Claim 7 is arranged in a vacuum chamber. An arrangement of this type in a vacuum chamber is prerequisite for the fact that the objective can be used in an EUV projection exposure apparatus.

Preferably, the objective has at least one displaceable counterweight for compensating for a variable force acting on the positioning device and/or on the objective. The counterweight is therefore also designated as a compensation weight. The counterweight makes it possible to at least partly compensate for forces on the objective frame which can be variable on account of a displacement of the positioning device and/or an alteration of the arrangement of the measuring device or measuring devices on the positioning device. This is advantageous particularly in the case of a positioning device having a degree of freedom of rotation. The compensation weight increases the stability of the metrology stage. Moreover, it is thereby possible to reduce, in particular prevent, the risk of deformation of the objective frame on account of a displacement of the metrology stage and thus an impairment of the optical quality of the objective by the metrology stage.

A further object of the invention is to improve a projection optical unit for projecting an object field into an image field and a projection exposure apparatus.

Preferably, the measuring device is arranged with respect to the beam path of the objective in between the last optical component of the objective and the image field, in particular the wafer stage. If the measuring device is considered a component independent of the objective, it is preferably arranged in between the objective and the image field, in particular the wafer stage.

Preferably, the projection exposure apparatus comprises a displaceable wafer holder, wherein the metrology stage with the measuring device or the measuring devices is displaceable independently of the wafer holder. The flexibility of the projection exposure apparatus is thereby increased. The metrology stage displaceable independently of the wafer holder enables, in particular, a parallel measurement of at least one parameter of the projection exposure apparatus and an exposure of a wafer by the projection exposure apparatus. In particular, the throughput of the projection exposure apparatus is thereby increased.

A further object of the invention is to improve a method for characterizing at least one component of a projection exposure apparatus.

Preferably, the parameter for characterizing the projection exposure apparatus is measured at the same time as an exposure of a wafer. The measurement of the parameter can be performed, in particular, in an edge region of the maximally possible image field. In particular, a region outside the field exposed for the exposure of the wafer can be used for characterizing the projection exposure apparatus.

Further objectives of the invention are to specify a method for producing a component using the projection exposure apparatus, and a component produced by the method. The advantages of these subjects correspond to those which have already been discussed above.

Further details and advantages of the invention will become apparent from the description of a plurality of exemplary embodiments with reference to the drawings, in which:

DETAILED DESCRIPTION OF EXEMPLARY EMBODIMENTS

Figure 1:
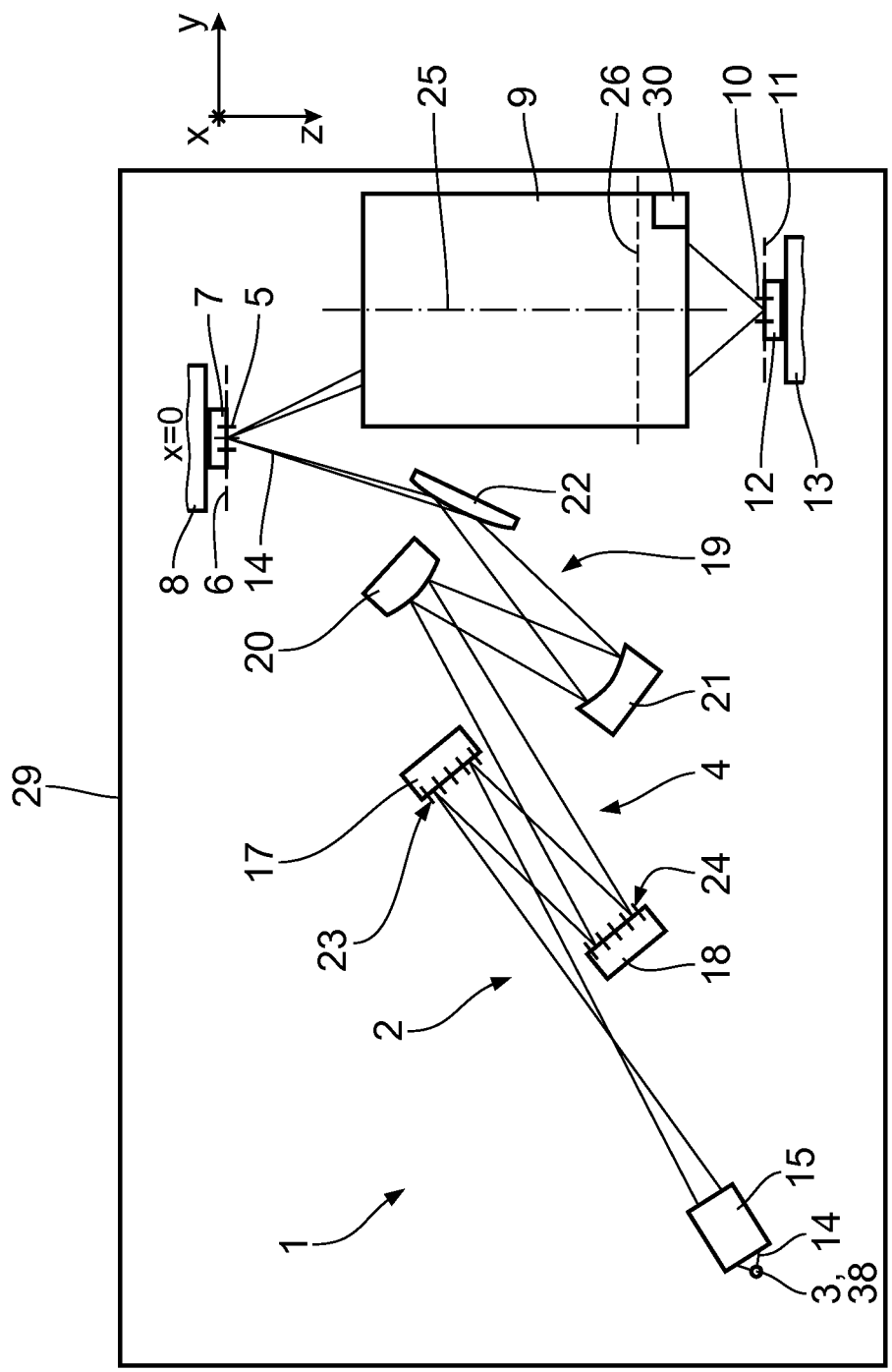
FIG. 1 shows a schematic illustration of a meridional section through a projection exposure apparatus for EUV projection lithography.

Firstly, the components of a projection exposure apparatus 1 for microlithography are described by way of example with reference to FIG. 1. In this case, the projection exposure apparatus 1 illustrated in FIG. 1 should be understood to be purely by way of example. The individual components, in particular the number and/or arrangement thereof, can also deviate from the embodiment illustrated in FIG. 1. The projection exposure apparatus 1 comprises an illumination system 2 with a radiation source 3 and an illumination optical unit 4 for the exposure of an object field 5 in an object plane 6. In this case, a reticle 7 arranged in the object field 5 is exposed, said reticle being held by a reticle holder 8, which is illustrated merely as an excerpt.

The projection exposure apparatus 1 furthermore comprises a projection optical unit 9 for imaging the object field 5 into an image field 10 in an image plane 11. A structure on the reticle 7 is imaged onto a light-sensitive layer of a wafer 12 arranged in the region of the image field 10 in the image plane 11, said wafer being held by a wafer holder 13, which is likewise illustrated schematically. The projection exposure apparatus 1 can have one, two or more wafer holders 13 for the displaceable arrangement of wafers 12 in the image plane 11. The wafer holders 13 can be embodied, in particular, as a so-called twin stage. A twin stage of this type can have two or more wafer receptacles for receiving wafers 12. For details of a twin stage of this type, reference should be made to EP 1 197 801 A1, for example.

The reticle holder 8 is also designated as a reticle stage. The wafer holder 13 is also designated as a wafer stage. In this case, a stage designates an, in particular displaceable, device for mounting, i.e. for positioning, an element such as, for example, the reticle 7, the wafer 12 or else a measuring device 16, which will be described in detail later.

The projection exposure apparatus 1, in particular the radiation source 3, the illumination system 2, the projection optical unit 9 and the wafer holder 13, is arranged in an evacuatable chamber 29.

The radiation source 3 is, in particular, an EUV radiation source which emits EUV radiation 14. The wavelength of the emitted used radiation of the EUV radiation source 3 is in the range of 5 nm to 30 nm, in particular 13.5 nm. Other wavelengths which are used in lithography and for which suitable light sources are available, for example DUV radiation sources having wavelengths of less than 300 nm or V-UV radiation sources having wavelengths of less than 200 nm, in particular at 193 nm, are also possible. The radiation source 3 can be a plasma source, for example a GDPP source or an LPP source. A radiation source based on a synchrotron can also be used as radiation source 3. Information about a radiation source of this type can be found by the person skilled in the art in U.S. Pat. No. 6,859,515 B2, for example.

The EUV radiation 14 is also designated as illumination light or as imaging light.

A collector 15 is provided for concentrating the EUV radiation 14 from the EUV radiation source 3.

The illumination optical unit comprises a field facet mirror 17 having a multiplicity of field facets 23. The field facet mirror 17 is arranged in a plane of the illumination optical unit 4 that is optically conjugate with respect to the object plane 6. The illumination light 14 is reflected from the field facet mirror 17 to a pupil facet mirror 18 of the illumination optical unit 4. The pupil facet mirror 18 has a multiplicity of pupil facets 24. With the aid of the pupil facet mirror 18, the field facets 23 of the field facet mirror 17 are imaged into the object field 5. For each field facet 23 on the field facet mirror 17 there is exactly one associated pupil facet 24 on the pupil facet mirror 18. Consequently, a light channel is formed between respectively one field facet 23 and one pupil facet 24. The facets 23, 24 of at least one of the facet mirrors 17, 18 can be embodied in switchable fashion. They can be arranged, in particular, in tiltable fashion on the facet mirror 17, 18. In this case, it is possible to embody only a portion, for example at most 30%, at most 50% or at most 70%, of the facets 23, 24 in tiltable fashion. Provision can also be made for embodying all of the facets 23, 24 in tiltable fashion. The switchable facets 23, 24 are, in particular, the field facet 23. By tilting the field facets 23, the assignment thereof to the respective pupil facets 24 and thus the formation of the light channels can be varied. For further details of the facet mirrors 17, 18 having tiltable facets 23, 24, reference should be made to DE 10 2008 009 600 A1.

Furthermore, the illumination optical unit 4 comprises a so-called transfer optical unit 19 having mirrors 20, 21 and 22. The last mirror 23 of the transfer optical unit 19 is a mirror for grazing incidence ("grazing incidence mirror"). The pupil facet mirror 18 and the transfer optical unit 19 form a subsequent optical unit for transferring the illumination light 14 into the object field 5. The transfer optical unit 19 can be dispensed with particularly when the pupil facet mirror 18 is arranged in an entrance pupil of the projection optical unit 9.

For simpler description of positional relationships, a Cartesian xyz coordinate system is depicted in the figures. In this case, the z-axis runs respectively in the direction of an optical axis 25 of the projection optical unit 9. For reasons of clarity, the optical axis 25 is not illustrated in every one of the figures. The object plane 6 and the image plane 11 in each case run perpendicular to the optical axis 25 and thus parallel to an xy plane.

The reticle holder 8 is displaceable in a controlled manner such that, during the projection exposure, the reticle 7 can be displaced in a displacement direction in the object plane 6 parallel to the y-direction. The wafer holder 13 is correspondingly displaceable in a controlled manner such that the wafer 12 is displaceable in a displacement direction in the image plane 11 parallel to the y-direction. As a result, the reticle 7 and the wafer 12 can be scanned firstly through the object field 5 and secondly through the image field 10. The displacement direction is also designated as the scanning direction. The shifting of the reticle 7 and of the wafer 12 in the scanning direction can preferably be effected synchronously with one another.

Figure 3:
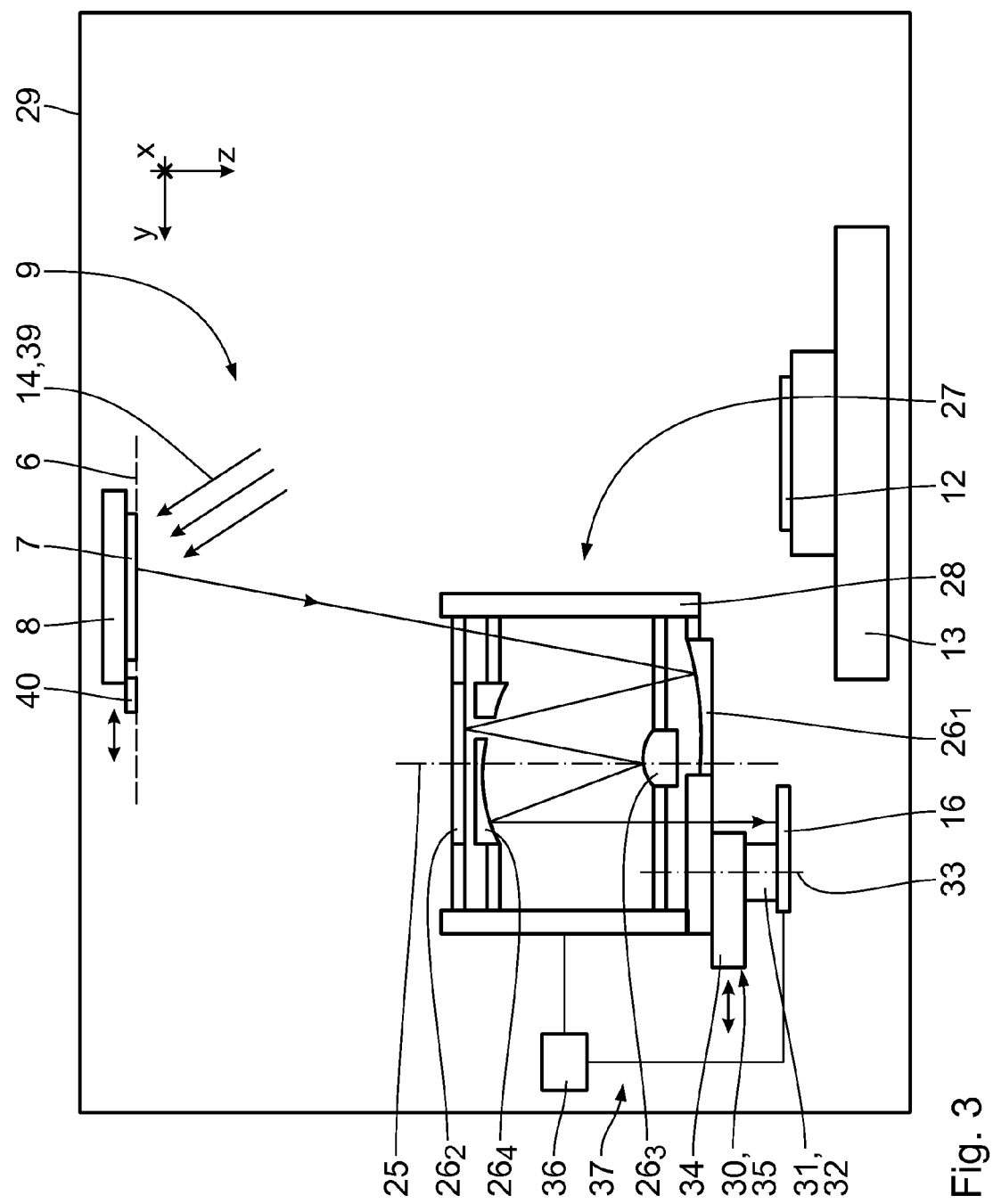
FIG. 3 to FIG. 11 show illustrations in accordance with FIG. 2 of further exemplary embodiments.

For details of the construction of the field facet mirror 17, reference is made, for example, to DE 10 1007 041 004 A1, in particular FIG. 3 thereof.

The projection optical unit 9 comprises a multiplicity of projection mirrors 26, which are not specifically illustrated in FIG. 1. The projection optical unit 9 comprises in particular at least three, in particular at least four, in particular at least 5, projection mirrors 26. It can have in particular at least six, seven or eight projection mirrors 26. A projection optical unit 9 having four mirrors $26_1$ to $26_4$ is illustrated by way of example in FIGS. 2 to 5 and 8 to 11. In this case, the last mirror in the beam path has a passage opening for the imaging light 14. The projection mirrors 26 are part of an objective 27 of the projection exposure apparatus 1. They form, in particular, optical components of the objective 27. The objective 27 can have further optical components, for example filters and/or diaphragms, which are not illustrated in the figures. The optical components are held by an objective frame 28. The objective frame 28 generally forms an objective mount for mounting the optical components of the objective 27.

According to the invention, a metrology stage 30—designated generally as a positioning device—for holding the measuring device 16 is arranged on the objective frame 28. In particular, a plurality of measuring devices 16 can be arranged on the metrology stage 30. The metrology stage 30 is connected to the objective frame 28. It is connected in particular directly to the objective frame 28. The metrology stage 30 is connected to the objective frame 28 in particular at least three points. The type of connection is dependent on the materials used for the objective frame 28 and the metrology stage 30. By way of example, adhesive bonding, screw connection, soldering, laser welding or electron beam welding is possible for the connection of the metrology stage 30 to the objective frame 28. A non-magnetic connection is preferred.

The metrology stage 30 is displaceable relative to the objective frame 28. It has at least one degree of freedom of displacement for displacing the measuring device 16. It is displaceable in particular in a direction transversely, in particular perpendicular, with respect to the optical axis 25. It can therefore be moved into a measurement position in the beam path of the imaging light 14 in the objective 27. It can likewise be moved out of the beam path of the imaging light 14. It can be displaced, in particular, into a parking position, in which it is situated completely outside the beam path of the imaging light 14 in the objective 27. It can be arranged in particular in a targeted manner in a specific edge region of the beam path. It can be arranged in particular in an edge region which is not used for the exposure of the wafer 12. In this case, it is possible to make use of the fact that the objective 27 has a maximum field size which projects beyond the image field 10 to be exposed at the level of the image plane 11 in a direction perpendicular to the optical axis 25. The edge region projecting beyond the image field 10 is not used for the exposure of the wafer 12.

The displaceability of the metrology stage 30 in a direction transversely with respect to the optical axis 25 can be in particular at least 1 mm, in particular at least 1 cm, in particular at least 5 cm.

The metrology stage 30 comprises an xy-adjuster 34 for displacing the measuring device 16 in a direction transversely, in particular perpendicular, with respect to the optical axis 25. Furthermore, the metrology stage 30 can have a z-adjuster 31 for displacing the measuring device 16 in the direction of the optical axis 25. The measuring device 16 is therefore displaceable in the direction of the optical axis 25 of the projection optical unit 9 by the metrology stage 30. As a result, it is possible to arrange the measuring device 16 near the pupil, in particular in the region of a pupil plane, or near the field, in particular in the region of the image plane 11 or of an intermediate image plane. In this case, an arrangement of the measuring device 16 near the pupil should be understood to mean an arrangement for which the following condition is met:

$P(16)=D(SA)/(D(SA)+D(CR))>0.5$, in particular $P(16)>0.7$.

In this case, D(SA) is the subaperture diameter of a beam emerging from an object field at the location of the measuring device 16, and D(CR) is the maximum distance of chief rays of an effective object field, measured in a reference plane of the optical system, in the region of the measuring device 16. The reference plane can be a plane of symmetry or a meridional plane of the optical system. The definition of the parameter P(16) corresponds to that indicated in WO 2009/024164 A1. In a field plane, $P(16)=0$ holds true. In a pupil plane, $P(16)=1$ holds true. An arrangement of the measuring device 16 near the field should be understood to mean an arrangement for which $P(16)<0.5$, in particular $P(16)<0.3$.

The metrology stage 30 can be configured to place the measuring device 16 in direction of the beam path of the objective 27 outside a range, in which the projection mirrors 26 are arranged. In particular, the metrology stage 30 can be configured to place the measuring device 16 in direction of the beam path of the objective 27 after the last of the projection mirrors 26, i.e. in between the last projection mirror 26 and the wafer stage 13. The measuring device 16 can thus be considered to be arranged outside of the objective 27 in direction of the beam path.

The metrology stage 30 can also have a rotary bearing 32. With the aid of the rotary bearing 32, the measuring device 16 is rotatable about a rotation axis 33. The rotation axis 33 is, in particular, parallel to the optical axis 25. The rotary bearing 32 enabling a rotation of the measuring device 16 also enables rotary calibrations additional to shift calibrations. This makes it possible to determine Zernike field offsets. Moreover, a better conditioning of the calibration method, i.e. a higher accuracy, is thereby achieved.

The xy-adjuster 34, the z-adjuster 31 and the rotary bearing 32 are parts of a drive device 35 for displacing the metrology stage 30, in particular the measuring device 16. The drive device 35 is, in particular, a vacuum-compatible drive. Furthermore, the drive device 35 is preferably free of interaction with magnetic fields. Consequently, the drive device 35 in particular does not react to external magnetic fields or changes thereof. Conversely, the drive device 35 does not generate magnetic fields. Consequently, the drive device 35 is, in particular, free of interaction with parts of the wafer holder 13, in particular with a drive thereof.

The drive device 35 comprises, in particular, one or a plurality of piezo-drives 58. The drive device 35, in particular the piezo-drives 58, are distinguished in particular by a very high resolution. A resolution of up to 30 pm can be achieved. Furthermore, a holding force of up to 600 N can be generated by the drive device 35. The drive device 35 offers, in principle, an actuating distance of unlimited length.

Figure 17:
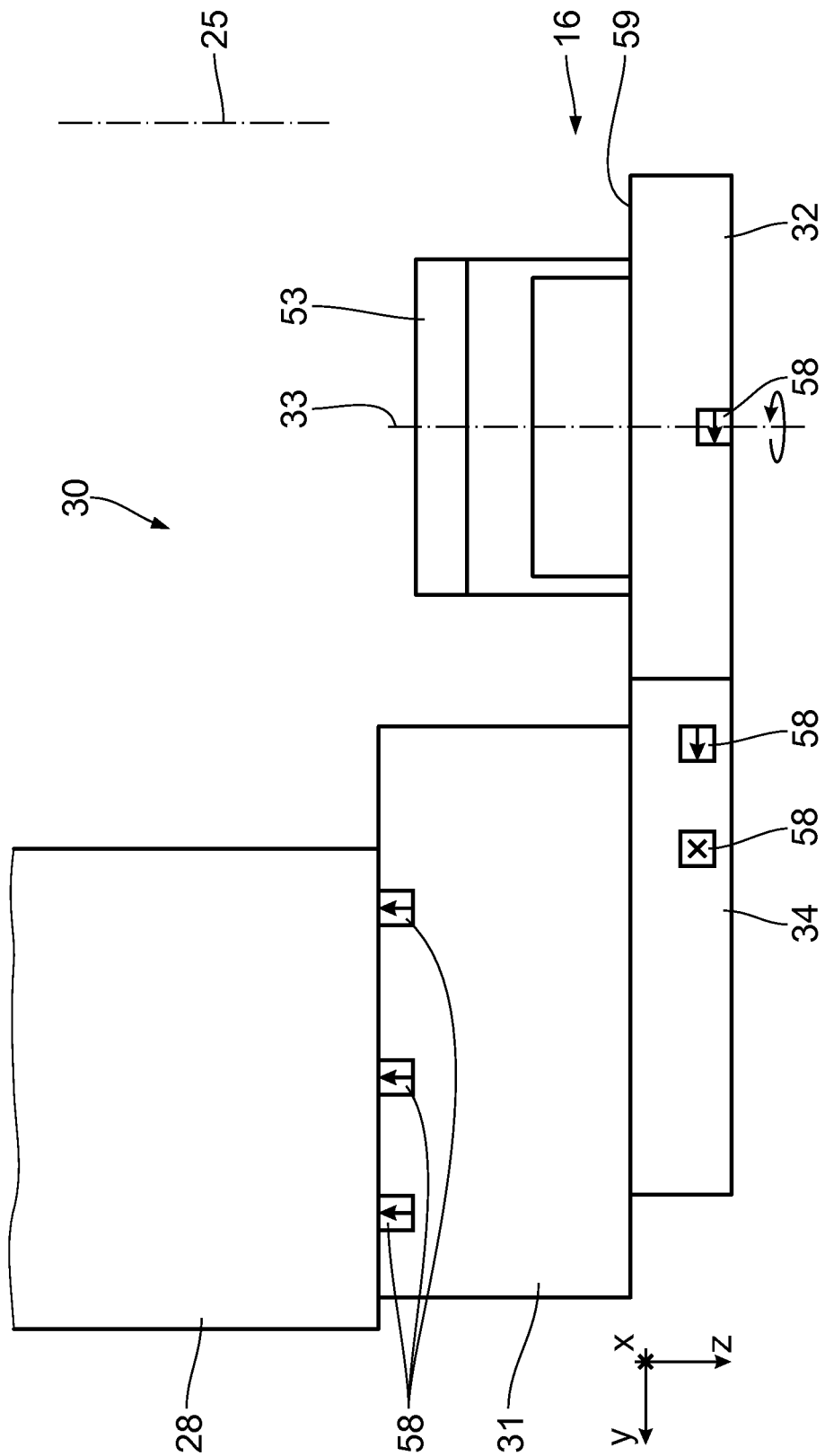
FIG. 17 shows an exemplary illustration of details of the measuring device.

As is illustrated by way of example in FIG. 17, the z-adjuster 31 can have three piezo-drives 58. With the three piezo-drives 58 of the z-adjuster 31, the plane in which the measuring device 16 is arranged can be unambiguously defined. In principle, it is also possible to form the z-adjuster 31 with a single piezo-drive 58. The xy-adjuster 34 preferably comprises two piezo-drives 58. In this case, in particular, one of the piezo-drives 58 can serve for adjusting the metrology stage 30 in the x-direction. The other piezo-drive 58 serves, in particular, for adjusting the metrology stage 30 in the y-direction.

The rotary bearing 32 can also have a piezo-drive 58. With the aid of the piezo-drive 58 of the rotary bearing 32, in particular a rotary table 59, on which the measuring device 16 is arranged, is rotatable about the rotation axis 33.

As a result of the arrangement of the metrology stage 30 on the objective 27, said stage can be optimized for the intended use. A decoupling of the metrology stage 30 from the wafer holder 13 makes it possible, in particular, to avoid high scanning speeds during the displacement of the measuring devices 16. Moreover, it is possible to realize degrees of freedom of rotation for calibration. Furthermore, it is possible to achieve a very high stiffness and thus a particularly high stability of the arrangement of the measuring devices 16. This is advantageous in particular for so-called "line of sight" (LOS) measurements. Finally, the arrangement of the metrology stage 30 on the objective 27 reduces fault influences during the measurement of the objective 27.

The objective 27 can additionally have an actuator 36 for calibrating it. The actuator 36 is connected to at least one of the measuring devices 16 in particular in a data-transmitting manner. The objective 27 therefore has a feedback.

With regard to the details of the measuring devices 16, reference should be made to US 2011/001 3171 A1, for example.

The metrology stage 30 with the measuring devices 16 is part of a measuring system 37 for characterizing at least one component of the projection exposure apparatus 1. The measuring system 37 additionally comprises at least one measurement radiation source 38 for generating measurement radiation. In the embodiments illustrated in FIGS. 2, 3, 6 and 7, the measurement radiation source 38 is identical to the radiation source 3 of the illumination system 2 of the projection exposure apparatus 1. In these exemplary embodiments, the EUV radiation 14 serves both for projecting the reticle 7 onto the wafer 12, i.e. the object field 5 into the image field 10, and as measurement radiation 39. In these exemplary embodiments, therefore, the measurement radiation 39 has the same wavelength as the illumination light.

Figure 2:
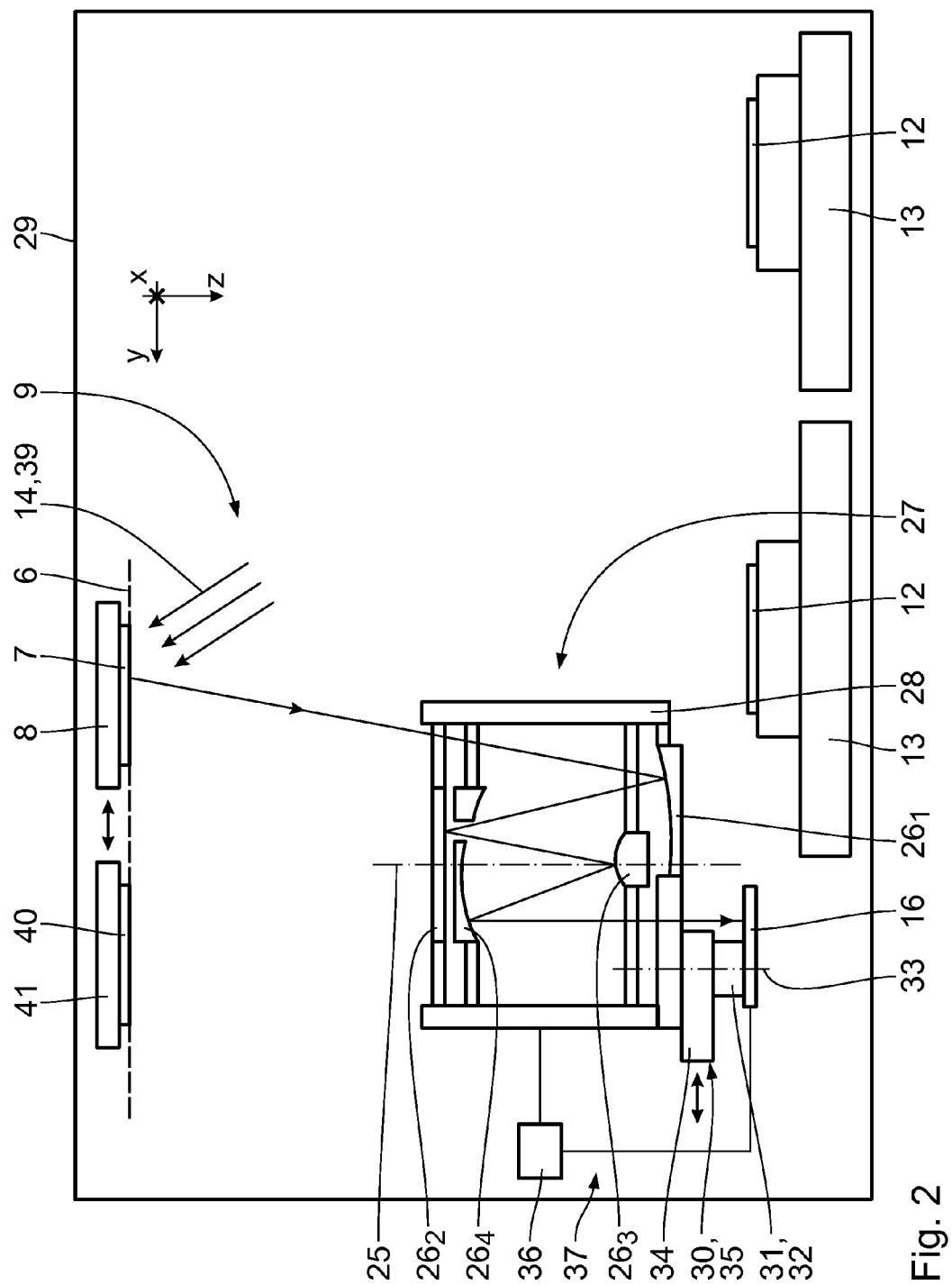
FIG. 2 shows a schematic illustration of an excerpt from the projection exposure apparatus in accordance with FIG. 1 for clarifying individual details of an objective with a measuring device in accordance with a first exemplary embodiment.

The measuring system 37 additionally comprises a special measurement reticle 40. As illustrated in FIG. 2, the measurement reticle 40 can be arranged on a separate measurement reticle mount 41, which is also designated as a measurement reticle stage. The measurement reticle 40 is arranged, in particular, in the object plane 6. The measurement reticle mount 41 is preferably displaceable independently of the reticle holder 8. It is displaceable in particular in a direction transversely, in particular perpendicular, with respect to the optical axis 25. It can also be rotatable about an axis parallel to the optical axis 25. In principle, it can also be displaceable in the direction of the optical axis 25.

Figure 15:
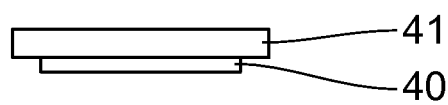
FIG. 15 shows a schematic illustration of a reticle holder.
Figure 15A:
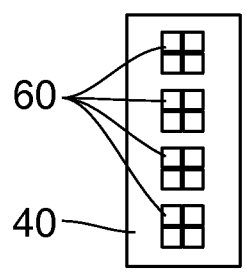
FIG. 15a, FIG. 15b show illustrations of two exemplary measuring reticles.
Figure 15B:
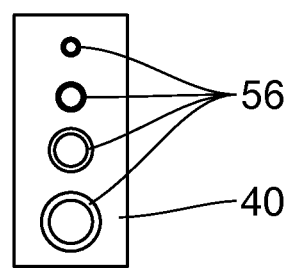

Different embodiments of the measurement reticle 40 are illustrated by way of example in FIGS. 15a and 15b. The measurement reticle 40 can be embodied, in particular, as a chromium mask. It can have grating structures 60 and/or ring structures 56. For details, reference should be made to U.S. Pat. No. 7,333,216 B2 for example. The measurement reticle 40 is displaceable by the measurement reticle mount 41. It is displaceable in particular in a direction perpendicular to the optical axis 25, i.e. in particular in the object plane 6. It can, in particular, also be rotatable about an axis parallel to the optical axis 25.

The measurement reticle 40 can be introduced alternately with the reticle 7 into the beam path of the projection exposure apparatus 1. As an alternative thereto, the measurement reticle 40 can be illuminated with measurement radiation 39 in parallel, i.e. simultaneously, with the reticle 7.

A rotatability of the measurement reticle 40 and/or of the metrology stage 30 is advantageous in particular for the calibration of the measurement techniques provided, for example wavefront measurement technique and/or stray light measurement technique, for determining the distortion component of the wavefront (Z2, Z3). In this case, the measurement reticle 40 is measured in different calibration positions during calibration. These positions differ in terms of the translation and/or rotation of the measurement reticle 40 in the object plane 6 and/or of the measuring device 16 in the image plane 11. By way of example, four positions of the measurement reticle 40 that are respectively rotated by 90° in relation to one another are possible for the calibration. In particular, the relative arrangement of the measurement reticle 40 with respect to the measuring device 16 is altered for the calibration. The measurement reticle 40 and the measuring device 16 are then rotated in particular relative to one another.

In the embodiment in accordance with FIG. 3, which substantially corresponds to that in accordance with FIG. 2, the measurement reticle 40 is arranged just like the reticle 7 on the reticle holder 8. A separate measurement reticle mount 41 can be omitted. In this case, the measurement reticle 40 can be displaceable together with the reticle 7. It can also be arranged in a stationary manner, in particular with respect to the reticle 7.

Figure 4:
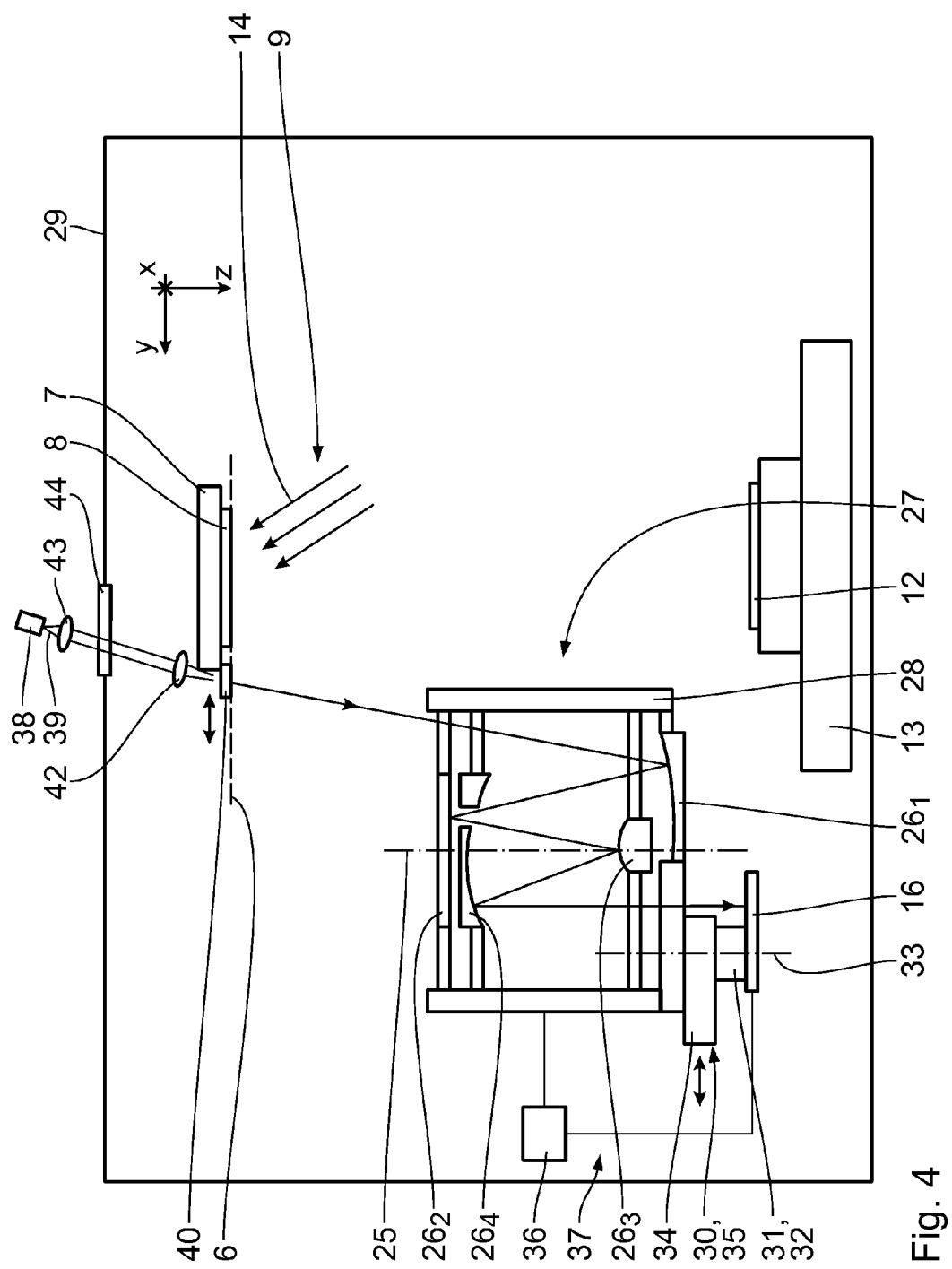

In the exemplary embodiment in accordance with FIG. 4, a separate measurement radiation source 38 is provided, which is different from the radiation source 3. In this case, a light-emitting diode (LED), for example, serves as the measurement radiation source 38. The measurement radiation source 38 can also have a multiplicity of LEDs. In this case, the LEDs are arranged, in particular, in one or a plurality of rows and/or columns. They can all emit measurement radiation 39 having the same wavelength. They can also emit measurement radiation 39 having different wavelengths.

The measurement radiation 39 from the measurement radiation source 38 is directed onto the measurement reticle 40 by an imaging optical unit 42. The imaging optical unit 42 can comprise in particular a diffusing device 43, for example a diffusing screen or a diffusing rod. In this exemplary embodiment, the measurement radiation source 38 can be arranged outside the evacuatable chamber 29. It can send radiation into the evacuatable chamber 29 in particular through a vacuum-tight window 44. In principle, the measurement radiation source 38 with the imaging optical unit 42 can also be arranged within the evacuatable chamber 29.

The imaging optical unit 42 can also have optical waveguides, in particular in the form of fibres, for example optical fibres for transferring the measurement radiation 39 from the measurement radiation source 38, in particular the LED or LEDs, to the measurement reticle 40. Utilizing a separate imaging optical unit 42, in particular a fibre-optic unit, it is possible to guide measurement radiation with a specific, desired numerical aperture onto the measurement reticle 40 in a simple manner.

The measurement radiation 39 is in a wavelength range which can be different from that of the illumination radiation 14. The wavelength of the measurement radiation 39 can be in the visible range, in particular. The measurement radiation 39 is, in particular, in a wavelength range to which the coating of the wafer 12 is insensitive. It can thereby be ensured that the measurement radiation 39, in particular a scattering thereof, has no undesired effect on the exposure of the wafer 12.

The measurement radiation source 38 can also particularly advantageously be integrated into the measurement reticle mount 41. For details of the measurement radiation source 38 for generating the measurement radiation 39 and the arrangement thereof, reference should be made to DE 10 2010 038 697.9, for example.

In the embodiments comprising a separate measurement radiation source 38, the measurement radiation 39 can be interrupted independently of the illumination light 14. Conversely, it is also possible, of course, for the illumination light 14 to be interrupted independently of the measurement radiation 39. The radiation source 3 can thereby be conserved.

Figure 5:
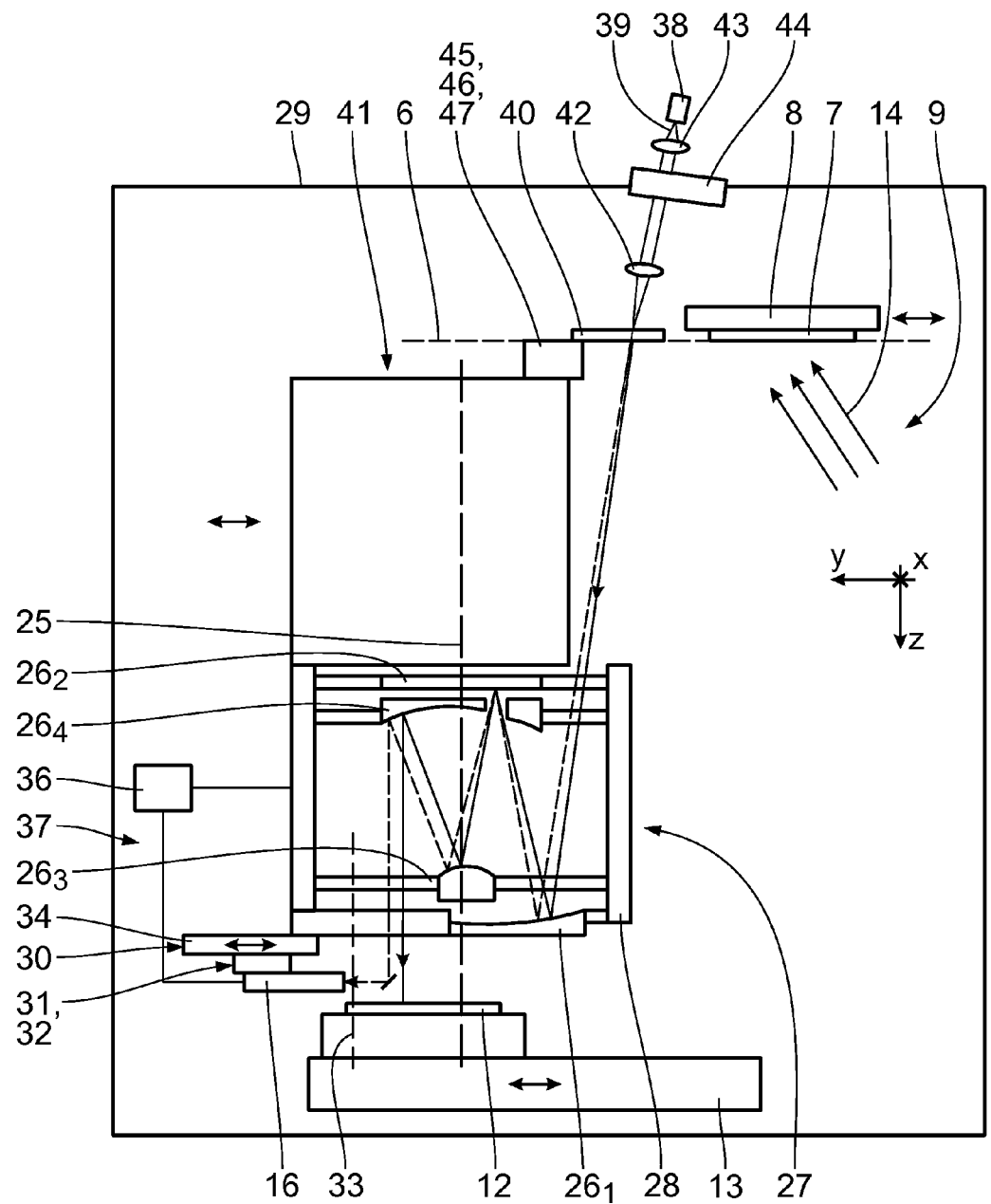

In the embodiment illustrated in FIG. 5, which substantially corresponds to that in accordance with FIG. 4, to the description of which reference is hereby made, the measurement reticle 40 is arranged on the measurement reticle mount 41 separate from the reticle holder 8. In this exemplary embodiment, the measurement reticle mount 41 is arranged on the objective 27, in particular on the objective frame 28, and in particular is connected thereto. In accordance with the metrology stage 30, in this case the measurement reticle mount 41 also comprises an xy-adjuster 45 and advantageously also a z-adjuster 46 and/or a rotary bearing 47. The xy-adjuster 45, the z-adjuster 46 and the rotary bearing 47 are again part of a drive 48. For details in this respect, reference should be made to the description of the drive 35 of the metrology stage 30.

In this exemplary embodiment, the measuring system 37 comprises a deflection mirror 49. The deflection mirror 49 is fixedly or adjustably connected to the metrology stage 30. It can also be arranged directly on the objective 27, in particular on the objective frame 28.

Figure 6:
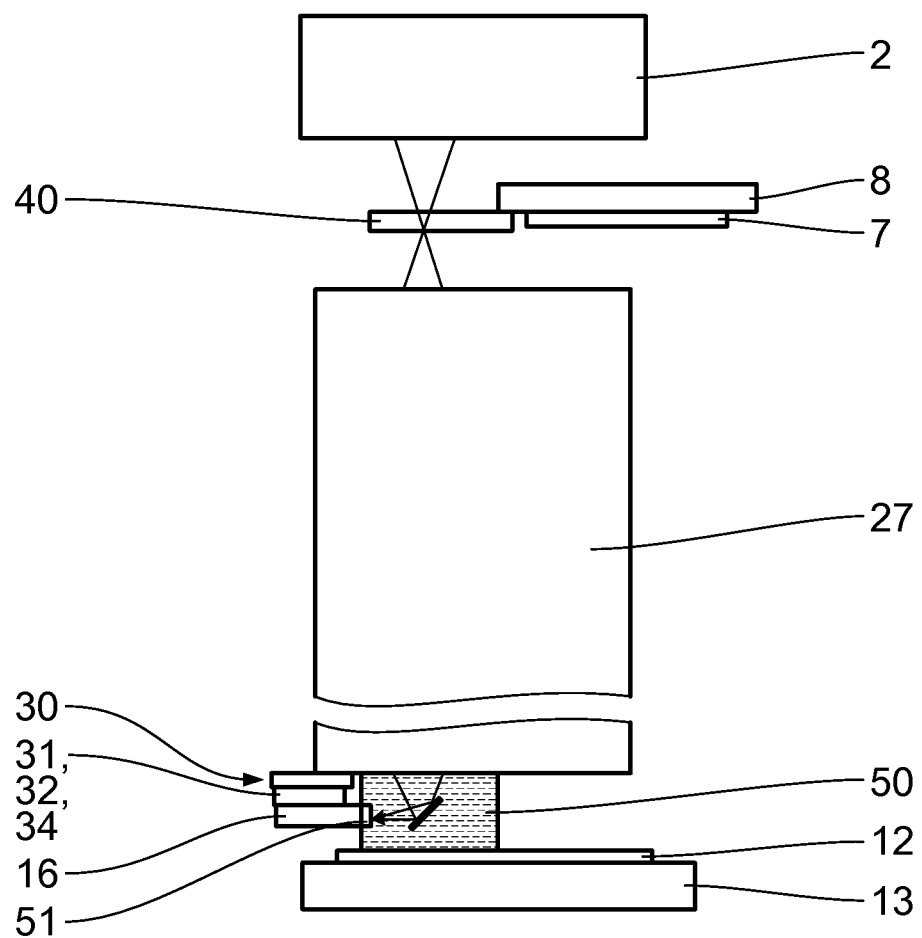
Figure 7:
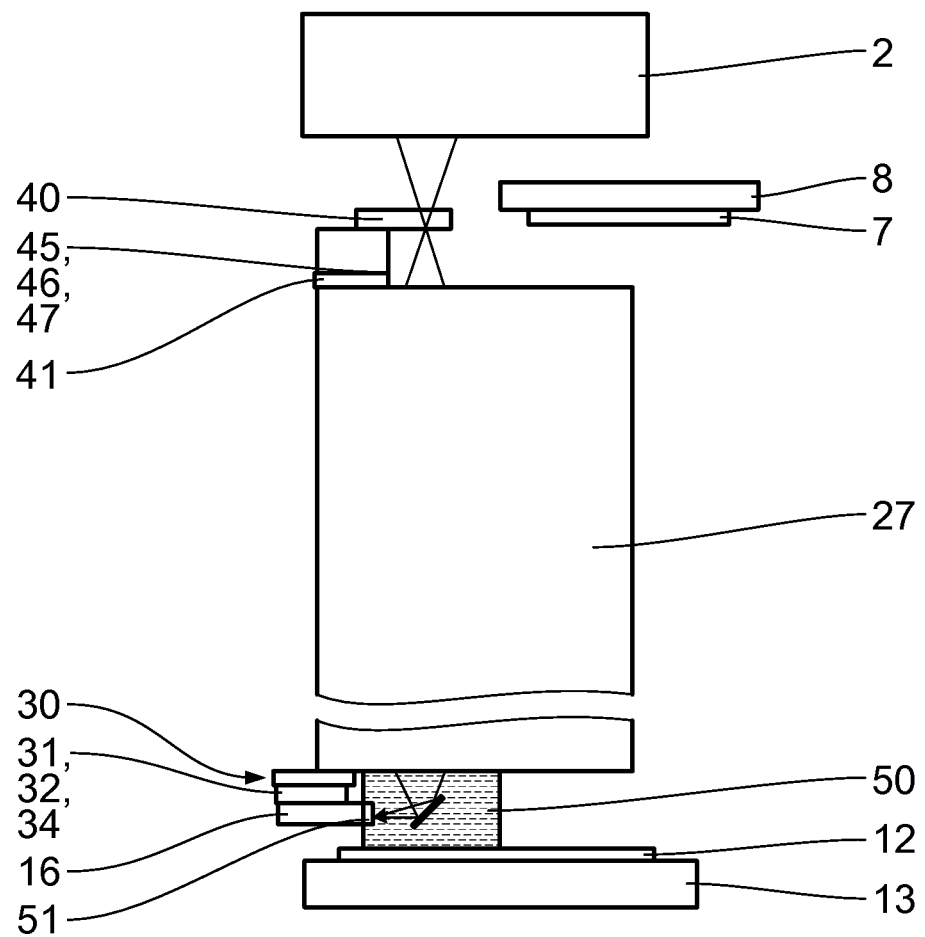

As illustrated in FIGS. 6 and 7, the arrangement of the metrology stage 30 on the objective 27 can also be provided in the case of so-called immersion scanners. The latter comprise, in particular, a radiation source 3, which generates illumination light 14 in the VUV range, in particular a wavelength of 193 nm. Illumination light 14 from a different wavelength range is likewise possible. An immersion liquid 50 is arranged between the objective 27 of the projection optical unit 9 and the wafer 12 to be exposed. Water, for example, serves as the immersion liquid.

The metrology stage 30 can be arranged at least partly outside the immersion liquid 50. The measuring device 16 comprises a detector 51, which is arranged in the immersion liquid 50 or at the interface with the immersion liquid 50. A quantum converter, in particular, can be involved in this case.

These embodiments have no evacuatable chamber 29. As is illustrated in FIG. 6, the measurement reticle 40 can be arranged together with the reticle 7 on the reticle holder 8. As an alternative thereto, it is likewise possible, as illustrated in FIG. 7, to introduce the measurement reticle 40 into the beam path by a separate measurement reticle mount 41. The measurement reticle mount 41 can in turn be arranged on the objective 27, in particular on the objective frame 28.

In accordance with the embodiments illustrated in FIGS. 8 to 11, the positioning device, in particular the metrology stage 30, comprises a compensation weight 52. The compensation weight 52 serves to compensate for a variable force acting on the metrology stage 30 and/or on the objective 27, in particular the objective frame 28. The leverage acting on the metrology stage 30 and on the objective 27, in particular the objective frame 28, is dependent, in particular, on the displacement of the metrology stage 30 and the arrangement of the measuring devices 16 thereon.

The compensation weight 52 is embodied, in particular, as a displaceable counterweight relative to a respective one of the measuring devices 16. It serves, in particular, for balancing the weight distribution of the metrology stage 30 with the measuring devices 16 with respect to the rotation axis 33. Via the compensation weight 52 it can be ensured, in particular, that the metrology stage 30 with the measuring devices 16 has a centre of gravity whose position is adjusted precisely such that the rotation axis 33 runs through this centre of gravity.

Figure 8:
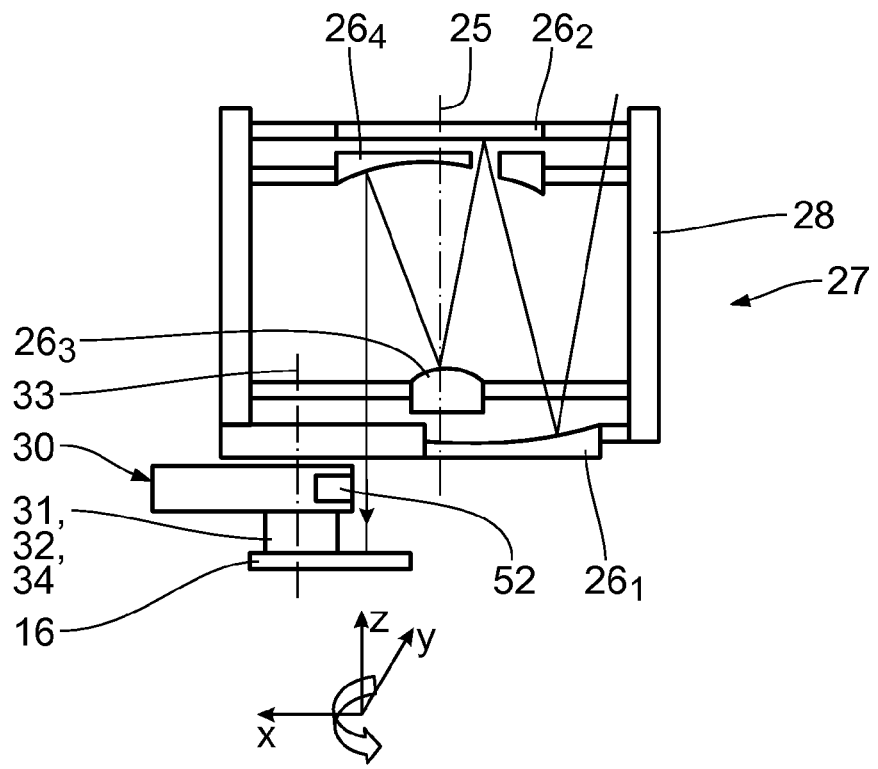

In the embodiment illustrated in FIG. 8, the compensation weight 52 is integrated into the metrology stage 30. In the embodiments illustrated in FIGS. 9 and 10, the compensation weight 52 is arranged separately on the metrology stage 30. It is displaceable in particular equally and oppositely with respect to a displacement of the metrology stage 30 relative to the rotation axis 33. It can be arranged with respect to the measuring device 16 on the opposite side of the metrology stage 30 or adjacent to the metrology stage 30 on the same side of the measuring device 16.

Figure 9:
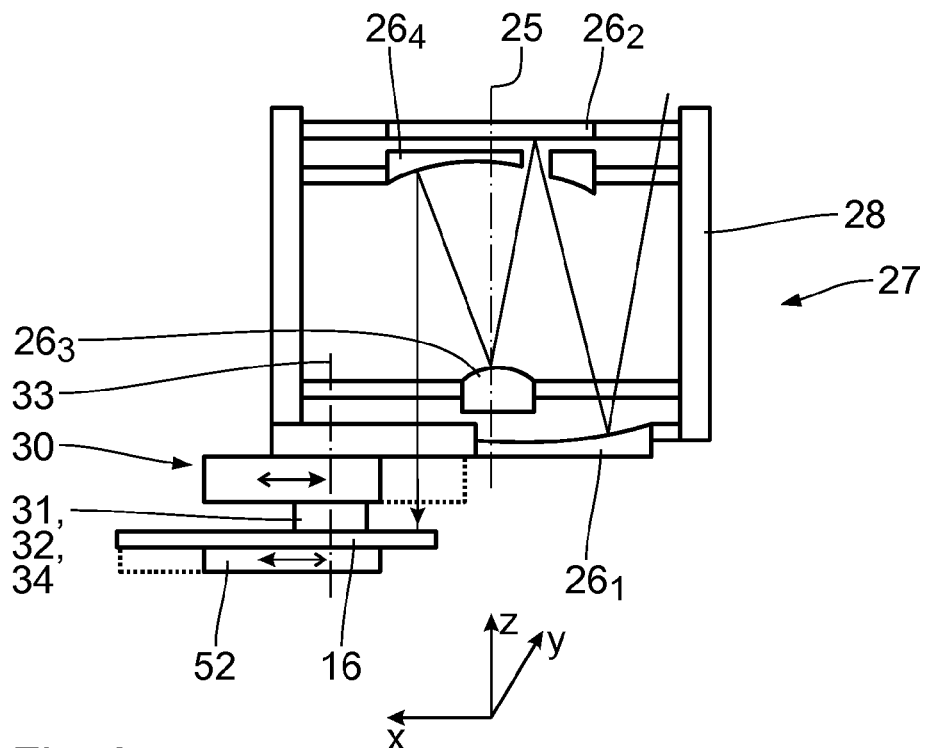
Figure 10:
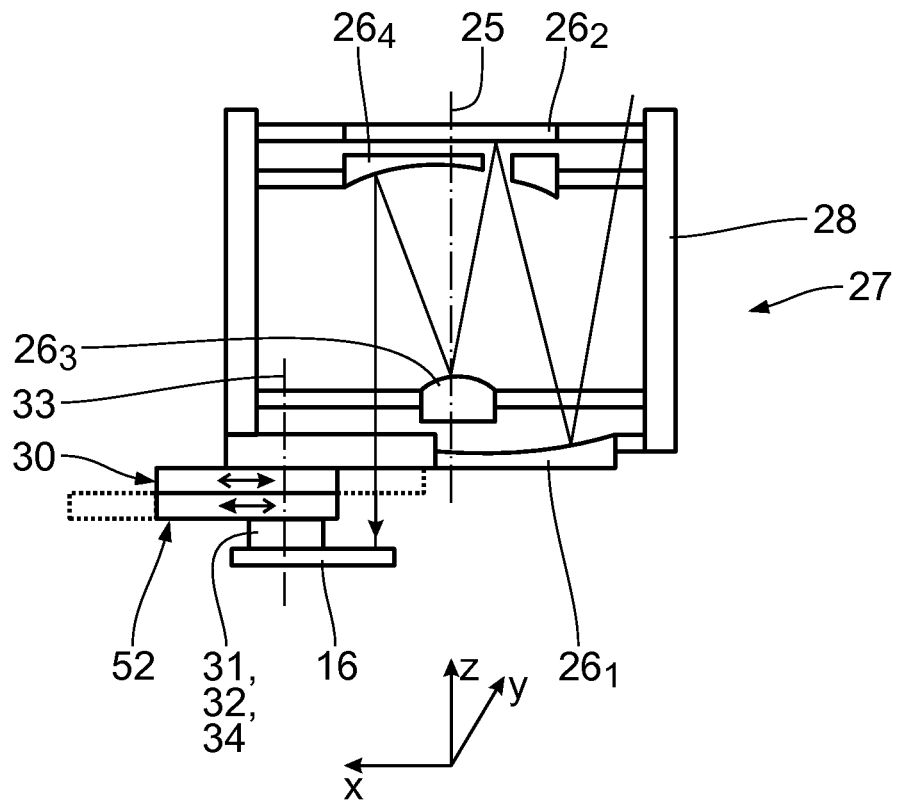
Figure 11:
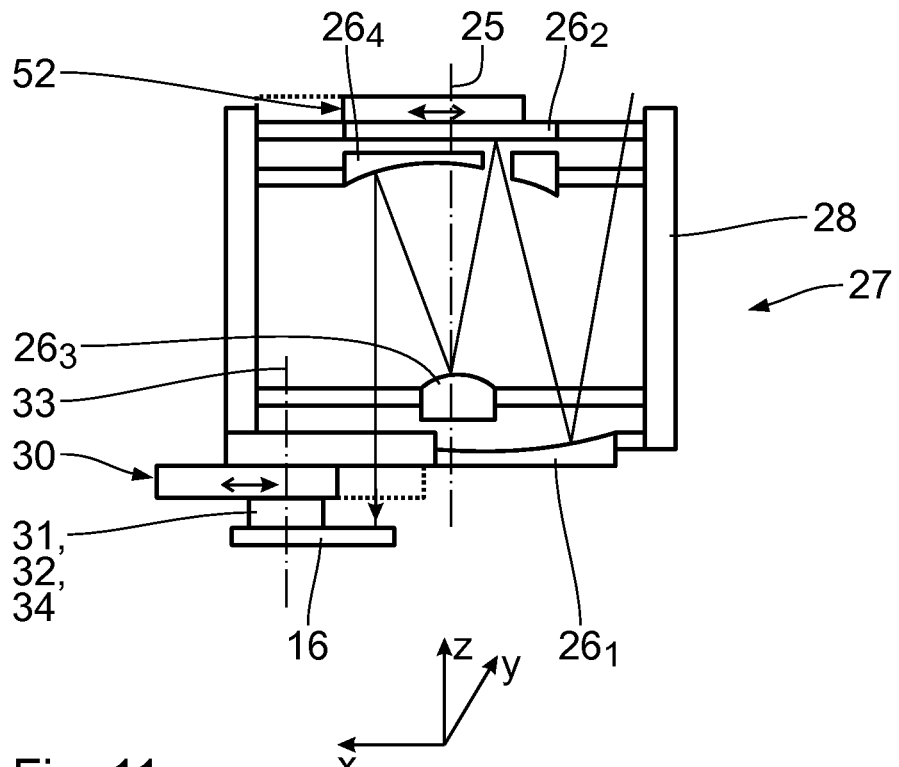

In order to clarify the displaceability of the compensation weight 52, FIGS. 9 to 11 illustrate in each case two different positions of the metrology stage 30 and of the compensation weight 52 using solid lines and in dotted fashion.

In the embodiment illustrated in FIG. 11, the compensation weight 52 is arranged on the opposite side of the objective 27 to the metrology stage 30 in the direction of the optical axis 25. This is advantageous in particular for the compensation of forces acting on the objective 27 transversely with respect to the optical axis 25.

The measuring device 16 can have in each case one or a plurality of gratings 53 and/or diaphragms 54. The grating or gratings 53 and/or the diaphragm or diaphragms 54 are/is adapted, in particular, to the structure of the measurement reticle 40.

Furthermore, the measuring device 16 comprises in each case a sensor device 55, in particular a CCD camera for the spatially resolved detection of electromagnetic radiation. The sensor device 55 is arranged at a distance from the grating 53 and/or the diaphragm 54 in the direction of the optical axis 25.

Figure 12:
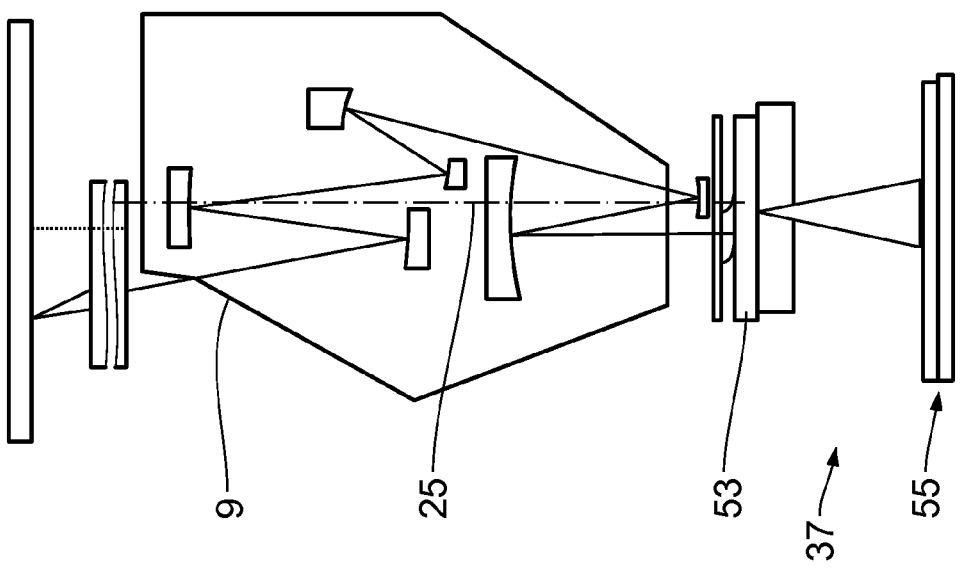

Preferably, the distance between the sensor device 55 and the grating 53 can be varied as required. By way of example, as illustrated in FIG. 12, a large distance between the grating 53 and the sensor device 55 may be advantageous for a serial measurement with a single measurement channel, whereas, as illustrated by way of example in FIG. 13, a small distance between the grating 53 and the sensor device 55 is advantageous for a parallel measurement with a multiplicity of measurement channels arranged alongside one another. The choice of the distance between the grating 53 and the sensor device 55 is dependent, in particular, on the numerical aperture of the objective 27 and/or the details of the structures of the measurement reticle 40. The distance is, in particular, in the range of 100 micrometers to 10 centimeters. In this case, the distance between the grating 53 and the sensor device 55 is chosen, in particular, in such a way that at least the first maxima of the diffraction patterns generated by the grating 53 are free of overlap in the region of the sensor device 55. A serial measurement is in this case provided, in particular, for the measurement of the aberrations $Z_5$ to $Z_{81}$. A parallel measurement is in this case provided, in particular, for the measurement of the aberrations $Z_2$ to $Z_{36}$.

Figure 13:
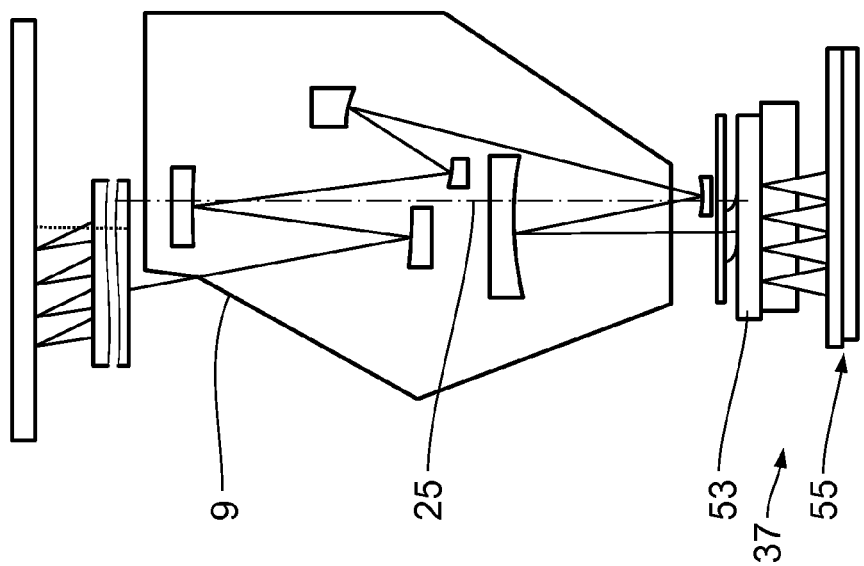
FIG. 12 and FIG. 13 show schematic illustrations of the beam path in the projection optical unit for clarifying the method according to the invention for characterizing at least one component of the projection exposure apparatus.

While the embodiment comprising one measurement channel and a large distance between grating and camera enables a magnified imaging of the pupil and thus also an accurate determination of higher Zernike orders, in particular Z5 to Z81, the parallel measurement of a multiplicity of measurement channels arranged alongside one another, as illustrated in FIG. 13, makes it possible to measure the wavefront over the entire image field 10 and thus to determine the distortion and the image shell. In principle, it is possible to arrange measuring devices 16 with different distances between grating and camera on a single metrology stage 30. The measuring systems 37 illustrated by way of example in FIGS. 12 and 13 can be integrated into a single measuring system 37 in particular by the metrology stage 30 according to the invention.

In order to characterize at least one component of the projection exposure apparatus 1, in particular of the objective 27, the metrology stage 30 is moved into the beam path of the measurement radiation 39, in particular into the illuminated field. It is moved, in particular, independently of the wafer holder 13. It can be moved, in particular, significantly more slowly than the wafer holder 13. Impairment of the measuring device 16 can thereby be avoided.

For a pupil transmission measurement, the measuring device 16 can be arranged near the pupil by the metrology stage 30. The pupil can then be traversed, i.e. scanned, in order to record measurement data by the metrology stage 30.

For the exposure of the wafer 12 with the illumination light 14, the measuring device 16 can be moved out of the beam path of the projection optical unit 9 laterally, i.e. transversely with respect to the optical axis 25. As an alternative thereto, the measuring device 16 can be arranged in an edge region of the exposed field which, in particular, is not used for imaging the reticle 7 onto the wafer 12. In this case, the characterization of the objective 27 can be performed in parallel, i.e. simultaneously, with the exposure of the wafer 12. In this case, a separate measurement radiation source 38 for generating measurement radiation 39 having a wavelength at which the coating of the wafer 12 is insensitive can advantageously be provided. For the parallel characterization of the objective 27 and illumination of the wafer 12, with the aid of the metrology stage 30 it is possible to make use of the fact, in particular, that the image field of the objective 27, in a manner governed by the construction, is somewhat larger than the image field 10 imaged onto the wafer 12. The radiation 14 in this edge region can be used for characterizing the objective 27, without impairing the imaging of the reticle 7 onto the wafer 12.

Since the characterization of the objective 27 can be performed in parallel, i.e. simultaneously, with the exposure of the wafer 12, the exposure of the wafer 12 does not have to be interrupted for characterizing the objective 27. Between the exposures of different wafers 12, it is also possible to effect measurement in the inner field region, in particular in the image field 11.

As a result of the arrangement of the metrology stage 30 on the objective 27, it is possible to use a larger region at the field edge for characterizing the objective 27, since fewer adjustment parameters in the form of safety tolerances have to be taken into account. On account of the larger usable region, it is possible to realize more different measurement techniques, for example also wavefront measurements with larger structures.

For applications appertaining to stray light metrology, the rotatability of the metrology stage 30 and/or of the measurement reticle 40 by the measurement reticle mount 41 is particularly advantageous. As a result of the rotation of the measuring device 16 by the metrology stage 30 and/or the measurement reticle 40 with the measurement reticle mount 41, it is possible to avoid non-measurable, so-called "forbidden" spatial frequencies.

Figure 14:
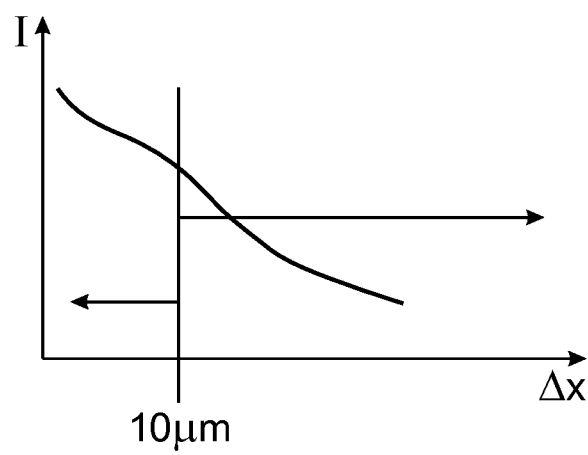
FIG. 14 shows a diagram for illustrating by way of example the dependence of the stray light intensity on the scattering range.

The dependence of the stray light intensity I on the scattering range Δx is illustrated by way of example in FIG. 14. Below a range of approximately 10 μm, use is made of wavefront measuring techniques for measuring the so-called short-range flare. Above a range of approximately 10 μm, use is made of techniques for measuring the stray light intensity in order to measure the so-called mid-range flare.

The metrology stage 30 makes it possible to simultaneously perform stray light measurements in the area of so-called short-range flare and mid-range flare. In particular, a wavefront measuring technique and stray light technique with a seamless transition in the stray light ranges is possible. For this purpose, structures for the wavefront and also for the stray light measuring technique are provided on the measurement reticle 40 and corresponding structures are also provided at the measuring device 16. Moreover, the measuring device 16 for this purpose has a resolution that is at least twice the magnitude of the ratio of the stray light range to be measured to the measurement wavelength divided by the numerical aperture of the objective 27.

As representative example of a characterization of at least one component of the projection exposure apparatus 1, a description is given below of a pupil-resolved stray light measurement with the aid of the measuring system 37 according to the invention. In this case, stray light should be understood to mean that portion of the illumination light 14 and/or of the measurement radiation 39 which deviates from the beam path of an idealized, perfect objective 27. In this case, the stray light range is a measure of this deviation in a direction perpendicular to the optical axis 25.

In this application, the measurement reticle 40 has a ring structure in accordance with FIG. 15b. It has, in particular, a plurality of ring structures 56 that form output regions for the measurement radiation 39. The ring structures 56 have different diameters in this case.

Figure 16:
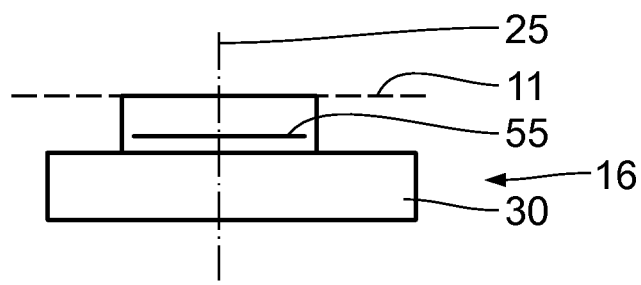
FIG. 16 shows a schematic illustration of a metrology stage with a measuring device.
Figure 16A:
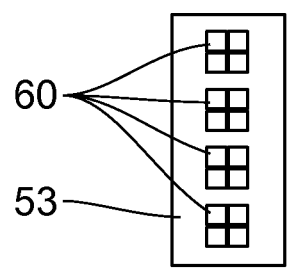
FIG. 16a shows illustrations of an exemplary embodiment of a measuring grating.
Figure 16B:
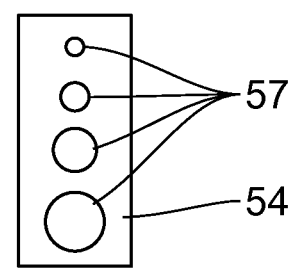
FIG. 16b shows an illustration of an exemplary embodiment of a measuring diaphragm.

In order to detect the stray light, a diaphragm 54 illustrated by way of example in FIG. 16b and having one or a plurality of pinholes 57 is arranged near the pupil. The number of pinholes 57 of the diaphragm 54 preferably corresponds exactly to the number of ring structures 56 of the measurement reticle 40. The pinholes 57 are adapted in terms of their embodiment, in particular in terms of their size, to the embodiment, in particular the size, of the ring structures 56 of the measurement reticle. The diaphragm 54 is arranged, in particular, in the region of a field plane. The measurement radiation 39 is detected by a CCD camera or some other spatially resolving detector. In this case, the detection is effected to a good approximation in a pupil-resolved manner. Since the stray light range in the pupil is small, and the scattering is thus to a good approximation pupil-maintaining, this measurement method makes it possible to determine the stray light as a function of the location in the pupil plane, without the pupil having to be correspondingly shaped in the illumination. Consequently, with a fully filled pupil, it is possible to a good approximation to measure and determine the stray light in any desired illumination setting.

With the measuring system 27 according to the invention it is possible to detect and recognize, for example, a decrease in the imaging quality of the projection exposure apparatus 1, in particular of the projection optical unit 9, on account of contaminations and/or deformations of the projection mirrors 26, in particular on account of thermal effects.

The details of the embodiments illustrated in the different figures, in particular the arrangement of the measurement reticle 40, the embodiment of the measurement radiation source 38 and the arrangement of the compensation weight 52, can, of course, be combined with one another in any desired fashion.

The above description of various embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

The invention claimed is:

1. A measuring system for characterizing at least one component of a projection exposure apparatus for extreme ultraviolet (EUV) projection lithography comprising
    a. at least one measuring device configured to measure an optical parameter from radiation traversing through an EUV objective of the projection exposure apparatus, wherein the EUV objective comprises a reflective optical element configured to reflect EUV radiation, and
    b. a positioning device configured to position the at least one measuring device,
    c. wherein the positioning device is configured to displaceably connect to the EUV objective of the projection exposure apparatus.

2. The measuring system according to claim 1, wherein the positioning device is configured to position the measuring device in EUV radiation projected from the EUV objective in a region of a projected beam path not used for exposure of a wafer; and
    wherein the measuring device is configured to measure the optical parameter during the exposure of the wafer from EUV radiation incident on the measuring device in the region of a projected beam path not used for exposure of the wafer.

3. The measuring system according to claim 1, further comprising a measuring radiation source providing the radiation traversing the EUV objective wherein the radiation comprises non-EUV radiation.

4. An objective for a projection exposure apparatus for extreme ultraviolet (EUV) projection lithography comprising
    a. at least one EUV optical component,
    b. an objective mount configured to mount the at least one EUV optical component
    c. a measuring device is configured to measure an optical parameter from radiation incident upon the EUV optical element, and
    d. a positioning device configured to position at least one measuring device,
    e. wherein the positioning device is connected to the objective mount, and
    f. wherein the positioning device has at least one degree of freedom of displacement for displacing the measuring device.

5. The objective according to claim 4, wherein the at least one EUV optical component is a last optical component of a plurality of optical components and the at least one measuring device is arranged in direction of the beam path of the objective after the last optical component.

6. The objective according to claim 4, wherein the positioning device is configured such that the at least one measuring device displaces between at least one measurement position in the beam path of the objective and a parking position completely outside the beam path of the objective.

7. The objective according to claim 4, further comprising an actuator for calibrating the objective, wherein the actuator is connected to the at least one measuring device via a data-transmitting path.

8. The objective according to claim 4, wherein the positioning device is free of interaction with magnetic fields.

9. The objective according to claim 4, further comprising an arrangement forming a vacuum chamber enclosing the EUV optical component, the objective mount and the positioning device.

10. The objective according to claim 4, further comprising at least one displaceable counterweight configured to compensate for a variable force acting on at least one of the positioning device and the objective.

11. A projection optical unit for projecting an object field into an image field, comprising
    a. an objective according to claim 4.

12. A projection exposure apparatus for EUV projection lithography comprising
    a. an illumination system and
    b. a projection optical unit according to claim 11.

13. The projection exposure apparatus according to claim 12, further comprising a displaceable wafer holder wherein the positioning device configured to position the at least one measuring device is displaceable independently of the wafer holder.

14. A method for characterizing at least one component of a projection exposure apparatus for EUV projection lithography, comprising:
    ing a projection exposure apparatus according to claim 12,
    providing at least one measuring device, which is positioned relative to the objective with the positioning device, and
    measuring at least one parameter for characterizing at least one component of the projection exposure apparatus with the at least one measuring device.

15. The method according to claim 14, wherein the measuring of the at least one parameter takes place at the same time as an exposure of a wafee.

16. A method for producing a microstructured component comprising:
    ing a projection exposure apparatus according to claim 12,
    providing a reticle,
    providing a wafer having a coating that is light-sensitive to illumination radiation,
    projecting at least one section of the reticle onto the wafer with the projection exposure apparatus, and
    developing the exposed coating on the wafer.

17. The objective according to claim 4, wherein the positioning device is configured to position the measuring device in EUV radiation projected from the objective in a region of a projected beam path not used for exposure of a wafer; and
    wherein the measuring device is configured to measure the optical parameter during the exposure of the wafer from the EUV radiation incident on the measuring device in the region of a projected beam path not used for exposure of the wafer.

18. The objective according to claim 4, further comprising a measuring radiation source providing the radiation traversing the at least one EUV optical component wherein the measurement radiation comprises non-EUV radiation.

* * * * *